United States Patent [19]

Kurozumi

[11] Patent Number: 5,218,241
[45] Date of Patent: Jun. 8, 1993

[54] AND CIRCUIT AND ADDRESS CIRCUIT EMPLOYING THE SAME

[75] Inventor: Tomohiro Kurozumi, Moriguchi, Japan

[73] Assignee: Matsushita Electric Industrial Co., Ltd., Osaka, Japan

[21] Appl. No.: 738,841

[22] Filed: Jul. 31, 1991

[30] Foreign Application Priority Data

Aug. 3, 1990 [JP] Japan ................... 2-207239

[51] Int. Cl.$^5$ ................... H03K 17/16; H03K 19/003
[52] U.S. Cl. ................... 307/443; 307/446; 307/449; 307/480; 365/177; 365/189.05; 365/189.08
[58] Field of Search ............... 307/443, 446, 480, 449; 365/177, 189.05, 189.08

[56] References Cited

U.S. PATENT DOCUMENTS 3,050,640  8/1962  Dillingham et al. ................ 307/446
3,986,042  10/1976  Padgett et al. ...................... 307/446
4,858,188  8/1989  Kobayashi ..................... 365/189.05

Primary Examiner—Robert J. Pascal
Assistant Examiner—Michael B. Shingleton
Attorney, Agent, or Firm—Ratner & Prestia

[57] ABSTRACT

An AND circuit having a first input terminal, a second input terminal and an output terminal, and is defined by a P-channel MOS FET, an N-channel MOS FET, a NPN bipolar transistor and a resistor. The P-channel MOS FET has a source connected to the first input terminal and a gate connected to the second input terminal. The N-channel MOS FET has a gate connected to the second input terminal, a source connected to the ground and a drain connected to the drain of the P-channel MOS FET. The transistor has a base connected to the drain of the P-channel MOS FET, and the collector-emitter thereof connected between an electric power supply line and the ground. The resistor is connected in series to the collector-emitter of the transistor. One end of the resistor is connected to the output terminal. The AND circuit has less MOS FETs so that the layout area can be reduced.

12 Claims, 13 Drawing Sheets

AND CIRCUIT AND ADDRESS CIRCUIT EMPLOYING THE SAME

BACKGROUND OF THE INVENTION

1. Field of the Invention

The present invention relates to an AND circuit and also to an address circuit employing such AND circuits and, more particularly, to an integrated memory circuit employing the address circuit which has a short delay time and can be assembled in a small layout area using bipolar CMOS circuit forming techniques.

2. Description of the Prior Art

In FIG. 11, an example of a prior art AND circuit is shown which is constructed using bipolar CMOS circuit technology. This is disclosed, for example, in a document entitled "Bipolar CMOS RAM for the High Speed and High Density Memory" in NIKKEI Electronic (1986, 3-10, PP 199-217).

With reference to FIG. 11, refe characters 1101, 1102 and 1105 designate P-channel MOSFET; 1103, 1104 and 1106, N-channel MOS FET; 1107 and 1108, NPN bipolar transistor; 1109 and 1110, resistors; 1111, a first input terminal; 1112, a second input terminal; 1113, NAND output terminal; and 1114, AND output terminal.

The following description will be directed to the operation of the AND circuit mentioned above. When the first input terminal 1111 and the second input terminal 1112 are in HIGH level, P-channel MOS FETs 1101 and 1102 are in a nonconductive state so that these FETs 1101 and 1102, close to supply no electric current from a power supply line Vcc. On the other hand, since N-channel MOS FETs 1103 and 1104 are in a conductive state, the electric potential at the NAND output terminal 1113 is in LOW level through the N-channel MOS FETs 1103 and 1104. As a result, P-channel MOS FET 1105 is in a conductive state while N-channel MOS FET 1106 is in a non-conductive state. Accordingly, NPN bipolar transistor 1107 is provided with an electric current at the base thereof to allow collector-emitter current to pass therethrough. Then, the output terminal 1114 of the AND circuit is in HIGH level. On the other hand, the NPN bipolar transistor 1108 receives no electric current to the base thereof to allow no collecto-remitter current to pass therethrough. As a result, the output terminal 1114 of the AND circuit is maintained at HIGH level.

Next, when either one of the first input terminal 1111 and the second input terminal 1112 is in a LOW level, either P type channel MOS FETS 1101 or 1102 is in a conductive state and is provided with the electric current from the power supply line Vcc. At this time, since either N type channel MOS FET 1103 or 1104 is in non-conductive state, the output terminal 1113 of the NAND is in HIGH level. Then, P type channel MOS FET 1105 is in a non-conductive state whereas N type channel MOS FET 1106 is in a conductive state. Accordingly, NPN bipolar transistor 1107 has the base supplied with no electric current and NPN bipolar transistor 1108 may receive through MOS FET 1106 a discharging current from line 1114, and hence the output terminal 1114 of AND is reduced to a LOW level.

FIG. 12 is a block diagram showing an example of an address circuit employing the AND circuit shown in FIG. 11 in combination with a word line driving circuit for driving a word line in a synchronized manner with respect to clocks.

With reference to FIG. 12, reference numeral 1201 designates a clock signal driving circuit; reference numeral 1202, a clock input line; a reference numeral 1203, a clock output line; reference numeral 1204, a decoder; reference numerals $1205_i$ ($i=1...n$), an address input line; reference numerals $1206_i$ ($i=1...2^n$), an address output line; a reference numeral 1207, a word line driver; reference numerals $1208_i$ ($i=1...2^n$), AND circuits; reference numerals $1209_i$ ($i=1...2^n$), word lines; reference numerals $1210_i$ ($i=1...2^n$), NAND circuit and reference numerals $1211_i$ ($i=1...2^n$), invertors.

The operation of the word line driver will be described. During a LOW level period of the clock signal at the clock output line 1202 in response to the clock input line 1201, decoder 1204 produces a HIGH level signal on one of its outputs $1206_i$ and produces LOW level signals on the remaining $2-1$ outputs. At this time, since the clock output line 1203 is in LOW level, $2^n$ AND circuits $1208_1...1208_{2^n}$ are all disabled to produce a LOW level signal from all of the AND output terminals $1114_1...1114_{2^n}$. Accordingly, all of the $2^n$ word lines 1209 are in LOW level to carry out no selection operation of word lines.

Next, during a HIGH level period of the clock signal at the clock output line 1203 in response to the clock input line 1202, decoder 1204 produces a HIGH level signal on said one of its outputs $1206_i$ so that the AND circuit $1208_i$ connected to said output $1206_i$ is enabled to produce a HIGH level signal from its output $1114_i$, and the remaining AND circuits are maintained disabled. Accordingly, only the word line 1209 connected to the AND output terminal 1114 in HIGH level is in HIGH level to carry out the operation for selecting the word line.

As understood from the above description, according to the prior art word line driving circuit of a clock synchronizing type, the AND circuit usually has a logic part formed by CMOS circuit technology and an output driver formed by bipolar circuit technology.

Thus, according to the prior art, the AND circuit employed in the word line driving circuit of a clock synchronizing type is manufactured by the CMOS circuit technology for forming the logic part and the bipolar circuit technology for forming the driver at the output stage. However the prior art word line driving circuit has a disadvantage that it is necessary to use a large number of the MOS transistors and bipolar transistors for forming one AND circuit and, as a consequence, a large area for the layout of the word line driving circuit is necessary.

Further, the word line driving circuit is required to have all of $2^n$ gates of the AND circuit supplied with signals from the clock output lines for achievement of the clock synchronization. Therefore, there is a problem to require a large size of gate capacitance, resulting in increase of the delay time at the word driving time.

SUMMARY OF THE INVENTION

The present invention has been developed with a view to substantially solving the above described disadvantages and has for its essential object to provide an AND circuit capable of reducing the delay time, input capacitance and the lay out area.

Another object of the present invention is to provide a address circuit assembled in a semiconductor integrated circuit capable of decreasing the delay time at the word driving period and also decreasing the area for the layout of the word line driving circuit in a clock synchronization type.

In order to accomplish these and other objects, the AND circuit according to the present invention comprises a P-channel MOS FET having the source connected to a first input terminal and the gate connected to a second input terminal; an N-channel MOS FET having the gate connected to a second input terminal, the source connected to the ground and the drain connected to the drain of said P-channel MOS FET; and an NPN bipolar transistor having the collector connected to an electric power supply line, the base connected to a junction between the drain of the P-channel MOS FET and the drain of the N-channel MOS FET and the emitter connected to both of an output terminal and the ground Vss through a resistor.

The modification of the AND circuit can be achieved by the following way in accordance with present invention. One modification is that the P-channel MOS FET is replaced with an N-channel MOS FET. Another modification is that the P-channel MOS FET is combined with an additional N-channel MOS FET.

The improvement of the AND circuit can be achieved in the following ways in accordance with the present invention. The resistor included in the AND circuit mentioned above is replaced with an N-channel MOS FET, or with a circuit comprising another NPN bipolar transistor, a second N-channel MOS FET and a third N-channel MOS FET in which the second N-channel MOS FET has the gate connected to a third input terminal, the source connected to said output terminal and the drain connected to the drain of the third N-channel MOS FET, the third N-channel MOS FET has the gate connected to the first input terminal, and the another NPN bipolar transistor has the corrector connected to said output terminal, the emitter connected to the ground and the base connected to a junction between the second and the third N-channel MOS FETs.

An address circuit according to the present invention comprises a clock signal driver having a clock input line attached thereto, a decoder consisting of $2^n$ NAND circuits and having n address input lines attached thereto and a word line driver consisting of $2^n$ AND circuits each of which is an AND circuit according to the present invention, wherein the clock signal driver is connected to the word line driver through a non-inverted clock output line and an inverted clock output line and the word line driver is provided with $2^n$ word lines and is connected at the $2^n$ second input terminals to the decoder at the $2^n$ address output lines.

The modification or the improvement of this semiconductor integrated circuit can be achieved by using the modified AND circuit or improved AND circuit according to the present invention.

The AND circuit according to the present invention is capable of reducing the delay time, input capacitance amount and the layout area, when compared with those of the prior art AND circuit constructed with a bipolar CMOS technology. The semiconductor integrated circuit according to the present invention is capable of reducing the word line driving time and the layout area in the word line driving circuit.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which

FIG. 1b is a block diagram of a first modification of the AND circuit shown in FIG. 1a;

FIG. 1c is a block diagram of a second modification of the AND circuit shown in FIG. 1a;

DETAILED DESCRIPTION OF THE PREFERRED EMBODIMENTS

Figure 1A:
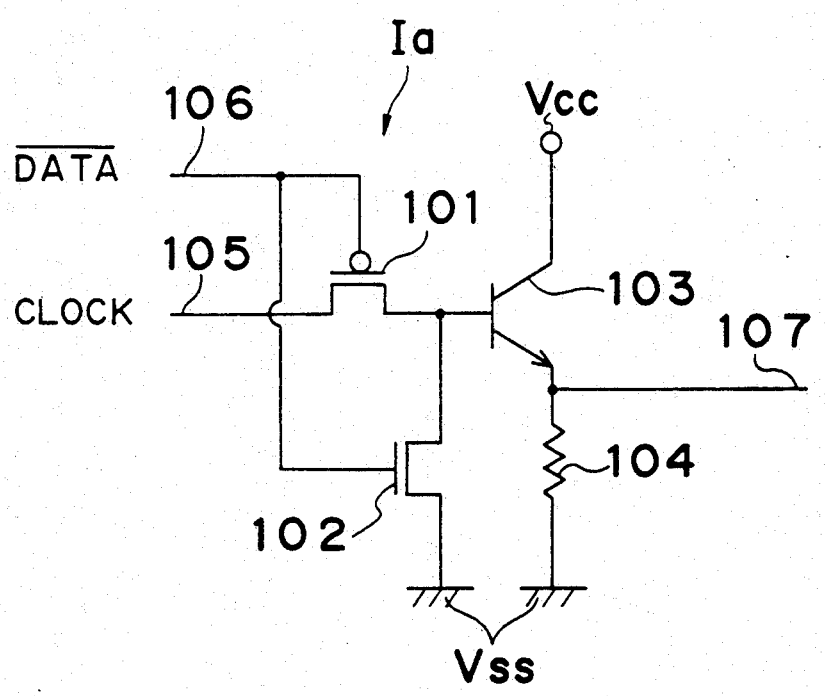
FIG. 1a is a block diagram of an AND circuit according to a first embodiment of the present invention.

Referring to FIG. 1a, a block diagram of the AND circuit Ia according to a first embodiment of the present invention is shown. In FIG. 1a, reference numeral 101 designates a P-channel MOS FET; reference numeral 102, an N-channel MOS FET; reference numeral 103, an NPN bipolar transistor; reference numeral 104, a resistor; reference numeral 105, a first input terminal; reference numeral 106, a second input terminal; and reference numeral 107, an AND output terminal.

According to the embodiments shown herein, the AND circuits are used in a memory circuit so as to receive CLOCK signal (in some cases $\overline{\text{CLOCK}}$ signal) and DATA signal (in some cases $\overline{\text{DATA}}$ signal). According to the first embodiment shown in FIG. 1a, the first input terminal 105 receives a CLOCK signal and the second input terminal 106 receives a $\overline{\text{DATA}}$ signal, but any other signal can be applied to input terminals 105 and 106.

The P-channel MOS FET 101 has its source connected to the first input terminal 105, the gate connected to the second input terminal 106 and the drain connected to a base of the NPN bipolar transistor 103. The N-channel MOS FET 102 has its gate connected to the second input terminal 106, the source connected to the ground Vss, and the drain connected to the base of transistor 103. The NPN bipolar transistor 103 has its collector connected to an electric power supply line Vcc and the emitter connected to the ground Vss through the resistor 104 and also to the output terminal 107.

In operation of the AND circuit Ia of FIG. 1a, when the second input terminal 106 receives LOW, the P-channel MOS FET 101 is set to a conductive state and, at the same time, the N-channel MOS FET 102 is set to a non-conductive state. Thus, the NPN bipolar transistor 103 receives the CLOCK signal at its base so that the output terminal 107 of the AND circuit Ia produces a signal synchronized with the CLOCK signal, that is a signal Vcc (a HIGH level signal) is produced when the CLOCK signal is HIGH and a signal Vss (a LOW level signal) is produced when the CLOCK signal is LOW.

Next, when the second input terminal 106 receives HIGH, the P-channel MOS FET 101 is set to a non-conductive state and, at the same time, N-channel MOS FET 102 is set to a conductive stat. Thus, the NPN bipolar transistor 103 is disabled to produce a LOW level signal from the output terminal 107 of the AND circuit Ia regardless of the CLOCK signal.

In summary, the AND circuit Ia is enabled when the signal $\overline{DATA}$ is LOW, and is disabled when the same is HIGH. To operate the AND circuit Ia, there is no condition requirement to follow, such as that necessary for AND circuits II, III, and V as explained later. However, such a condition can be applied, if necessary.

As apparent from the above, the AND circuit according to the present invention can be realized by using less of transistors, resulting in reduction of the delay time and miniaturization of the circuit layout.

Figure 1B:
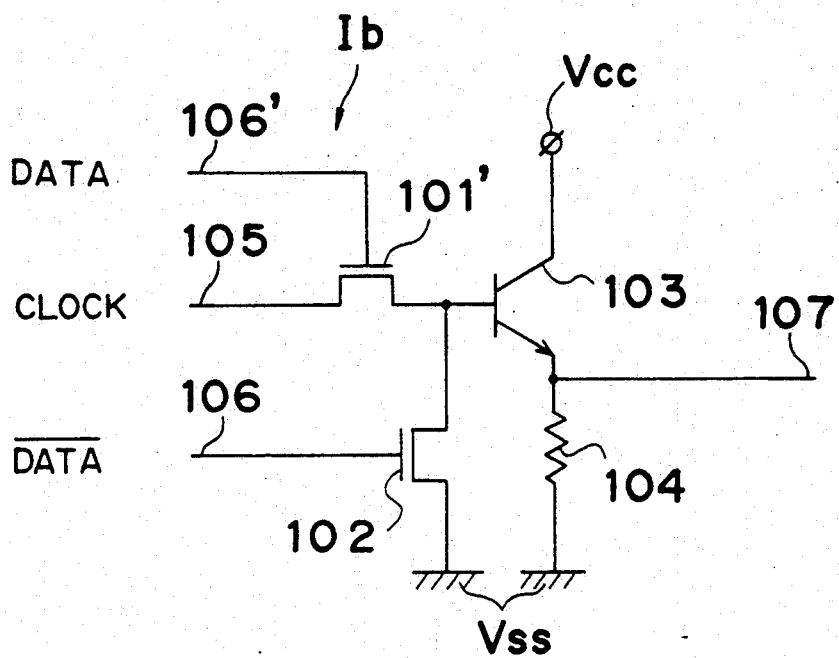

Referring to FIG. 1b, an AND circuit Ib is shown which is a first modification of the AND circuit Ia shown in FIG. 1a. Instead of the P-channel MOS FET 101, an N-channel MOS FET 101' is used. Furthermore, the gate of the N-channel MOS FET 101' is connected to a third input terminal 106, for receiving DATA signal. The gate of the N-channel MOS FET 102 is connected to the second input terminal 106 for receiving $\overline{DATA}$, as in the AND circuit Ia of FIG. 1a. The other circuit arrangement of AND circuit Ib is the same as that of AND circuit Ia.

In operation of the AND circuit of FIG. 1b, when the third input terminal 106' receives HIGH, the N-channel MOS FET 101' is set to a conductive state. Also, the N-channel MOS FET 102 is set to a non-conductive state by the LOW level signal applied thereto from the second input terminal 106. Since the signals applied to input terminals 106 and 106' are in opposite relationship with each other, the NPN bipolar transistor 103 receives the CLOCK signal at its base when the third input terminal 106' receives HIGH, so that the output terminal 107 of the AND circuit Ib produces a signal synchronized with the CLOCK signal.

Next, when the third input terminal 106' receives LOW, the N-channel MOS FET 101' is set to a non-conductive state and when the second input terminal 106 receives HIGH, N-channel MOS FET 102 is set to a conductive state. Thus, the NPN bipolar transistor 103 is disabled to produce a LOW level signal from the output terminal 107 of the AND circuit Ib regardless of the CLOCK signal.

In summary, the AND circuit Ib is enabled when the signal DATA is HIGH (that is when $\overline{DATA}$ is LOW), and is disabled when the same is LOW. Thus, the operation is substantially the same as the AND circuit Ia.

The AND circuit Ib of FIG. 1b can have the same advantage as that of the AND circuit Ia.

Figure 1C:
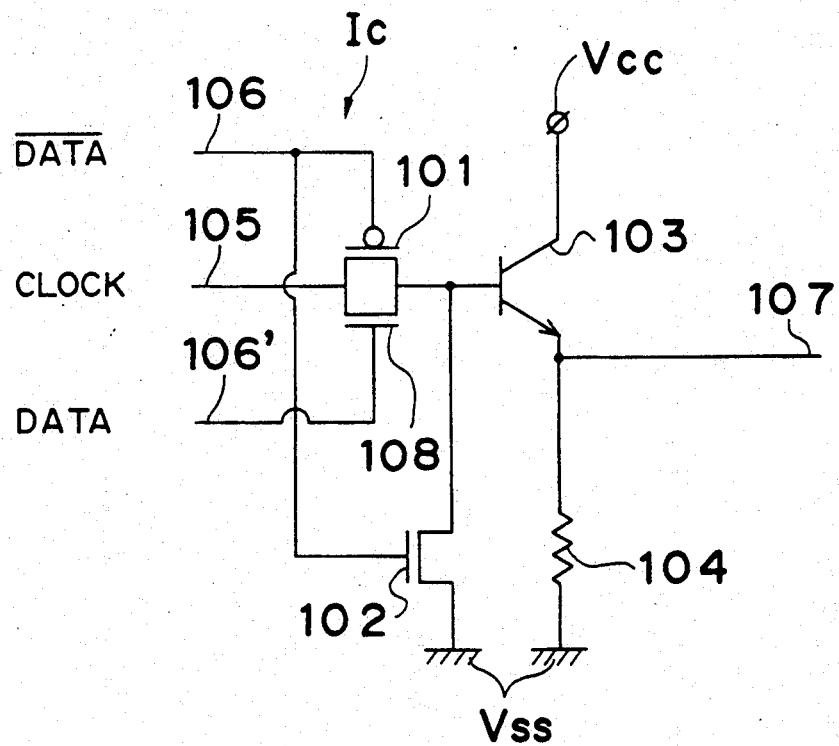

Referring to FIG. 1c, an AND circuit Ic is shown which is a second modification of the AND circuit Ia shown in FIG. 1a. In addition to the circuit of FIG. 1a, the AND circuit Ic of FIG. 1c further has an N-channel MOS FET 108 connected parallel to the P-channel MOS FET 101. The base of the N-channel MOS FET 108 is connected to a third input terminal 106' for receiving DATA signal.

In operation of the AND circuit of FIG. 1c, when the second input terminal 106 receives LOW and when the third input terminal 106' receives HIGH, the P-channel MOS FET 101 and the N-channel MOS FET 108 are set to a conductive state. Also, the N-channel MOS FET 102 is set to a non-conductive state by the LOW level signal applied thereto from the second input terminal 106. Since the signals applied to input terminals 106 and 106' are in opposite relationship with each other, FETs 101 and 108 are made conductive simultaneously. Thus, when the FETs 101 and 108 are made conductive, the NPN bipolar transistor 103 receives the CLOCK signal at its base so that the output terminal 107 of the AND circuit Ic produces a signal synchronized with the CLOCK signal.

Next, when the input terminals 106 and 106' receives HIGH and LOW, respectively, MOS FETs 101 and 108 are set to a non-conductive state, and also, N-channel MOS FET 102 is set to a conductive state. Thus, the NPN bipolar transistor 103 is disabled to produce a LOW level signal from the output terminal 107 of the AND circuit Ic regardless of the CLOCK signal.

In summary, the AND circuit Ic is enabled when the signal DATA is HIGH (that is when $\overline{DATA}$ is LOW), and is disabled when the same is LOW. Thus, the operation is substantially the same as the AND circuit Ia.

The AND circuit Ic can process the data a higher reliability than that of the AND circuit of FIG. 1a.

Figure 2:
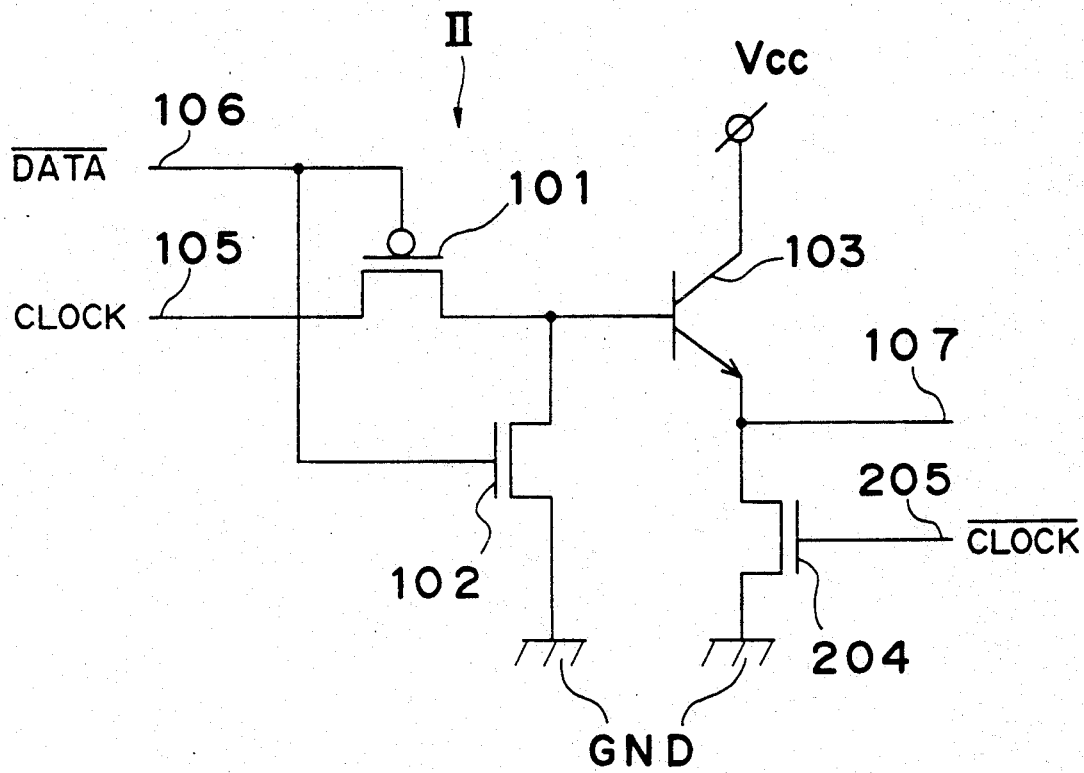
FIG. 2 is a block diagram of an AND circuit according to a second embodiment of the present invention.

Referring to FIG. 2, an AND circuit II according to a second embodiment of the present invention is shown. The difference from the AND circuit Ia shown in FIG. 1a is that the resistor 104 is replaced with an N-channel MOS FET 204, the gate of which is connected to a third input terminal 205 for receiving a $\overline{CLOCK}$ signal. Since resistor 104 used in the first embodiment has a fixed resistance, such a unit 104 is referred to as a self-determined impedance unit. In this respect, since N-channel MOS FET 204 used in the second embodiment opens or closes the path between the emitter of transistor 103 and the ground as controlled externally by $\overline{CLOCK}$ signal, such a unit 204 is referred to as a externally-determined impedance unit.

Since the AND circuit II having an externally-determined impedance unit is particularly suitable for use in a memory circuit, the operation described herein below is made in consideration of such a memory circuit.

In operation, during a first half cycle of the CLOCK signal (period P1 in FIG. 10), a LOW level CLOCK signal is applied to the input terminal 105 and a HIGH level $\overline{CLOCK}$ signal is applied to the input terminal 205. During this first half cycle P1, the $\overline{DATA}$ signal to be applied to the input terminal 106 is determined, whether it is a HIGH level signal or a LOW level signal. In other words, the $\overline{DATA}$ signal is delayed by a period T1+T2 (FIG. 10) from the beginning of the first cycle period P1. During this first half cycle period P1, since CLOCK signal is at the LOW level and, at the same time, $\overline{\text{CLOCK}}$ signal is at the HIGH level, transistor 103 is maintained off to produce a LOW level signal from the output terminal 107, no matter what level signal the $\overline{\text{DATA}}$ signal is.

Then, during a second half cycle of the CLOCK signal (period P2 in FIG. 10), a HIGH level CLOCK signal is applied to the input terminal 105 and a LOW level $\overline{\text{CLOCK}}$ signal is applied to the input terminal 205. During the second half cycle P2, when the $\overline{\text{DATA}}$ signal to be applied to the input terminal 106 was determined as LOW in the previous cycle, the P-channel MOS FET 101 is now in a conductive state and the N-channel MOS FET 102 is now in a non-conductive state. Thus, the HIGH level CLOCK signal from terminal 105 is applied to the base of transistor 103 to produce a HIGH level signal (word line selection signal) from output terminal 107. Such a HIGH level signal is enhanced by the LOW level $\overline{\text{CLOCK}}$ signal applied to the input terminal 205 to break the grounding of the emitter of transistor 103. On the other hand, when the $\overline{\text{DATA}}$ signal to be applied to the input terminal 106 was determined as HIGH in the previous cycle, the P-channel MOS FET 101 is now in a non-conductive state and the N-channel MOS FET 102 is now in a conductive state. Thus, a LOW level signal from N-channel MOS FET 102 is applied to the base of transistor 103 to produce no base-emitter current. Thus, when the output terminal 107 is at a LOW level determined by a memory cell (not shown) connected to the output terminal 107, the output terminal 107 is maintained at the LOW level. On the other hand, when the output terminal 107 is at a HIGH level determined by the memory cell connected thereto, the charge in the memory cell is discharged through line 107 and MOS FET 204 instantaneously.

As apparent from the above, by the employment of the N-channel MOS FET 204, it is possible to cut off the current path between the emitter of transistor 103 and the ground during a period at which the transistor 103 is turned on (made to a conductive state), or to establish the current path between the same during a period at which the transistor 103 is turned off (made to a non-conductive state) in the first half cycle. Thus, a clear output signal (word line selection signal) from the terminal 107 can be obtained that has a short response time and sharp edges at the level changing points.

Figure 3:
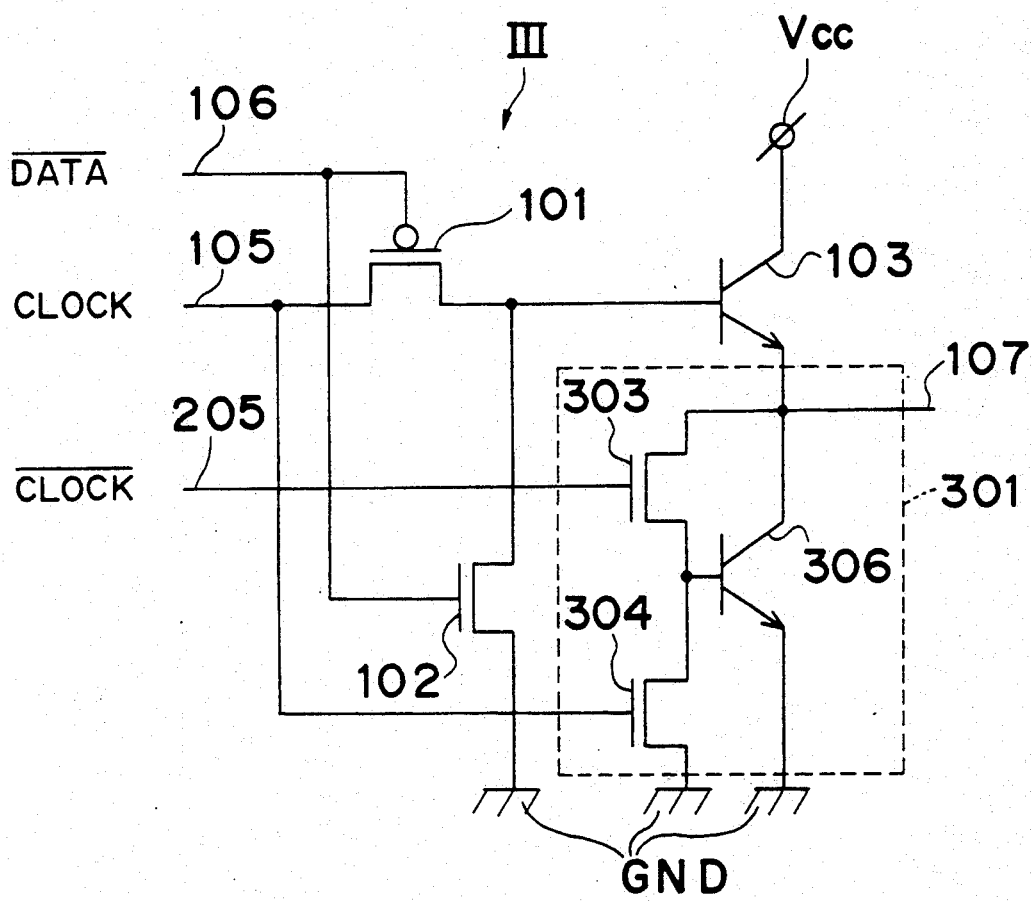
FIG. 3 is a block diagram of an AND circuit according to a third embodiment of the present invention.

Referring to FIG. 3 an AND circuit III according to a third embodiment of the present invention is shown. The difference from the AND circuit Ia shown in FIG. 1a is that the resistor 104 is replaced with an impedance unit 301 defined by two N-channel MOS FETs 303 and 304 connected in series between the emitter of transistor 103 and the ground, and a bipolar transistor 306 connected between the emitter of transistor 103 and the ground. The base of transistor 306 is connected to a junction between the MOS FETs 303 and 304. The gates of MOS FETs 303 and 304 are connected, respectively, to input terminals 205 and 105. Since the impedance of the impedance unit 301 is controlled externally by the CLOCK signal and $\overline{\text{CLOCK}}$ signal, impedance unit 301 is the externally-determined impedance unit.

The operation of the AND circuit III is substantially the same as that of the AND circuit II. The difference is merely in the impedance unit 301.

In operation, during a first half cycle of the CLOCK signal (period P1 in FIG. 10), a LOW level CLOCK signal is applied to the input terminal 105 and a HIGH level $\overline{\text{CLOCK}}$ signal is applied to the input terminal 205. During this first half cycle P1, the $\overline{\text{DATA}}$ signal to be applied to the input terminal 106 is determined, whether it be a HIGH level signal or a LOW level signal. During this first half cycle period P1, CLOCK signal is at the LOW level to turn off (i.e., in a non-conductive state) the MOS FET 304 and, at the same time, $\overline{\text{CLOCK}}$ signal is at the HIGH level to turn on (i.e., in a conductive state) the MOS FET 303. Also, during this first half cycle period P1, transistor 103 is maintained off to produce a LOW level signal from the output terminal 107, no matter what level signal the $\overline{\text{DATA}}$ signal is.

Then, during a second half cycle of the CLOCK signal (period P2 in FIG. 10), a HIGH level CLOCK signal is applied to the input terminal 105 and a LOW level $\overline{\text{CLOCK}}$ signal is applied to the input terminal 205. Thus, MOS FETs 303 and 304 are turned off and turned on, respectively. Thus, transistor 306 is turned off. During the second half cycle P2, when the $\overline{\text{DATA}}$ signal to be applied to the input terminal 106 was determined as LOW in the previous cycle, the P-channel MOS FET 101 is now in a conductive state and the N-channel MOS FET 102 is now in a non-conductive state. Thus, the HIGH level CLOCK signal from terminal 105 is applied to the base of transistor 103 to produce a HIGH level signal (word line selection signal) from output terminal 107. Such a HIGH level signal is enhanced by the turn-off state of the impedance unit 301. On the other hand, when the $\overline{\text{DATA}}$ signal to be applied to the input terminal 106 was determined as HIGH in the previous cycle, the P-channel MOS FET 101 is now in a non-conductive state, and the N-channel MOS FET 102 is now in a conductive state. Thus, a LOW level CLOCK signal from MOS FET 102 is applied to the base of transistor 103 to produce a LOW level signal (word line non selection signal) from output terminal 107.

Figure 4:
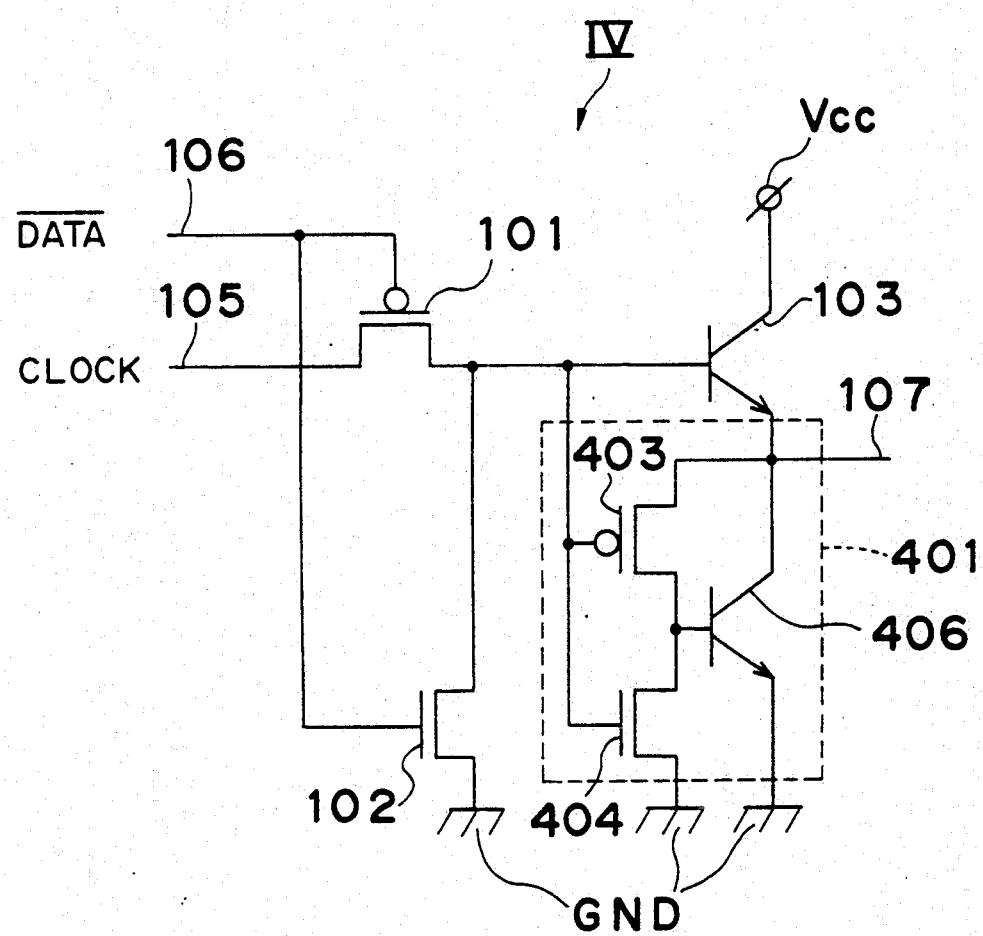
FIG. 4 is a block diagram of an AND circuit according to a fourth embodiment of the present invention.

Referring to FIG. 4 an AND circuit IV according to a fourth embodiment of the present invention is shown. The difference from the AND circuit Ia shown in FIG. 1a is that the resistor 104 is replaced with an impedance unit 401 defined by a P-channel MOS FET 403 and an N-channel MOS FET 404 connected in series between the emitter of transistor 103 and the ground, and a bipolar transistor 406 connected between the emitter of transistor 103 and the ground. The base of transistor 406 is connected to a junction between the MOS FETs 403 and 404. The gates of MOS FETs 403 and 404 are connected to the base of transistor 103. Since the impedance of the impedance unit 401 is controlled internally by the signal applied to the base of transistor 103, the impedance unit 401 is referred to an internally-determined impedance unit.

The operation of the AND circuit IV is substantially the same as that of the AND circuit I.

In operation of the AND circuit IV of FIG. 4, when the input terminal 106 receives LOW, the P-channel MOS FET 101 is set to a conductive state and, at the same time, the N-channel MOS FET 102 is set to a non-conductive state. Thus, the NPN bipolar transistor 103 receives the CLOCK signal to its base so that the output terminal 107 of the AND circuit IV produces a signal synchronized with the CLOCK signal. At this time, when the CLOCK signal is LOW, P-channel MOS FET 403 is turned on, and N-channel MOS FET 404 is turned off. However, when the CLOCK signal is HIGH to turn on transistor 103, P-channel MOS FET 403 is turned off, and N-channel MOS FET 404 is turned on. Thus, transistor 406 is turned off to maintain a HIGH level signal at output terminal 107.

Next, when the input terminal 106 receives HIGH, the P-channel MOS FET 101 is set to a non-conductive state and, at the same time, N-channel MOS FET 102 is set to a conductive state. Thus, the NPN bipolar transistor 103 is turned off. Also, P-channel MOS FET 403 is turned on and N-channel MOS FET 404 is turned off. At this time, when line 107 connected to a memory cell (not shown) is at a HIGH level determined by the data stored in the memory cell, the HIGH level is applied through line 107 and P-channel MOS FET 403 to the base of transistor 406 which is then turned on. Thus, the charge in the memory cell is discharged through line 107 and transistor 406. If there is no charge in the memory cell, the output terminal 107 is maintained at the LOW level. After the discharge, a LOW level signal is produced from the output terminal 107 of the AND circuit IV regardless of the CLOCK signal.

The externally-determined impedance units 204 and 301 operate in response to the CLOCK signal (or $\overline{CLOCK}$ signal), but the internally-determined impedance unit 401 operates when the $\overline{DATA}$ signal is at LOW level. Thus, the operation of the internally-determined impedance unit is not as busy as the externally-determined impedance unit.

Since the AND circuits I through IV is arranged such that CLOCK signal is applied to the source of P-channel MOS FET 101, the input capacitance can be made small.

Figure 5:
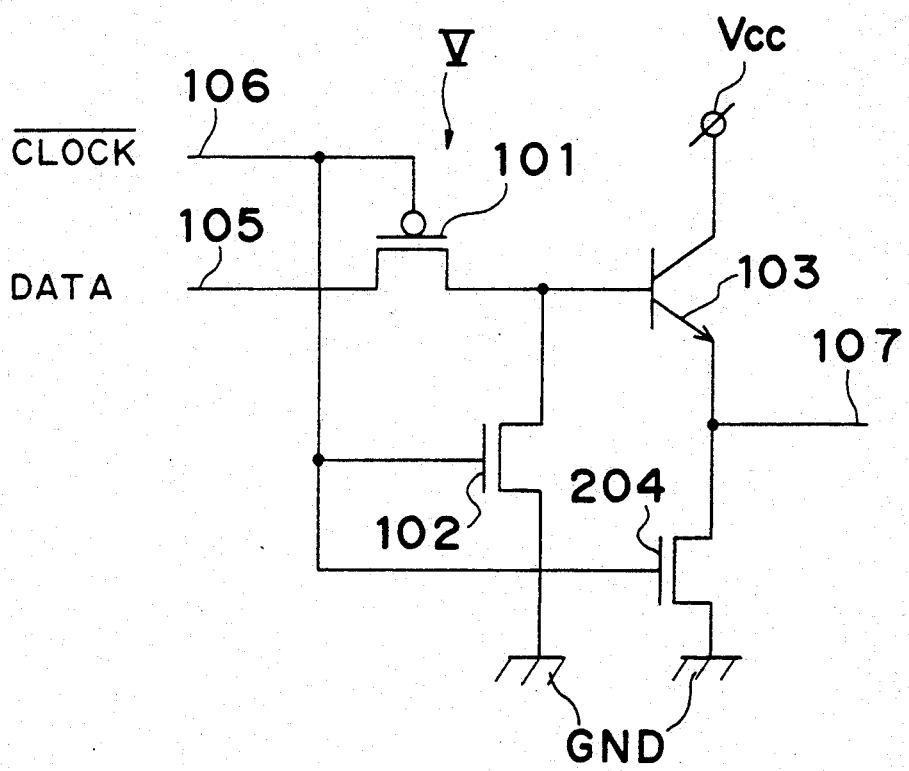
FIG. 5 is a block diagram of an AND circuit according to a fifth embodiment of the present invention.

Referring to FIG. 5, an AND circuit V according to a fifth embodiment of the present invention is shown. The AND circuit V has the same circuitry as the AND circuit II, but the signals applied to the input terminals 105 and 106 are different. The input terminal 105 receives $\overline{DATA}$ signal, and input terminal 106 receives $\overline{CLOCK}$ signal.

In operation, during a first half cycle of the CLOCK signal (period P1 in FIG. 10), a HIGH level $\overline{CLOCK}$ signal is applied to the input terminal 106 to produce a LOW level signal from output terminal 107. Then, during this first half cycle P1, the signal to be applied to the input terminal 106 is determined, whether it be a HIGH level signal or a LOW level signal. In other words, the $\overline{DATA}$ signal is delayed by a period T1+T2 (FIG. 10) from the beginning of the first cycle period P1. During this first half cycle period P1, since $\overline{CLOCK}$ signal is at the HIGH level, transistor 103 is maintained off to produce a LOW level signal from the output terminal 107, no matter what level signal the $\overline{DATA}$ signal is.

Then, during a second half cycle of the $\overline{CLOCK}$ signal (period P2 in FIG. 10), a LOW level $\overline{CLOCK}$ signal is applied to the input terminal 106 to turn on the P-channel MOS FET 101 and to turn off the N-channel MOS FET 204. During the second half cycle P2, when the $\overline{DATA}$ signal to be applied to the input terminal 105 was determined as LOW in the previous cycle, a LOW level signal is applied to transistor 103 to produce a LOW level signal from output terminal 107. On the other hand, when the $\overline{DATA}$ signal to be applied to the input terminal 106 was determined as HIGH in the previous cycle, a HIGH level signal is applied to transistor 103 to produce a HIGH level signal from output terminal 107.

In any of the AND circuits II through V described above, it is possible to form modifications, such as shown in FIGS. 1b and 1c for the first AND circuit Ia.

Figure 6:
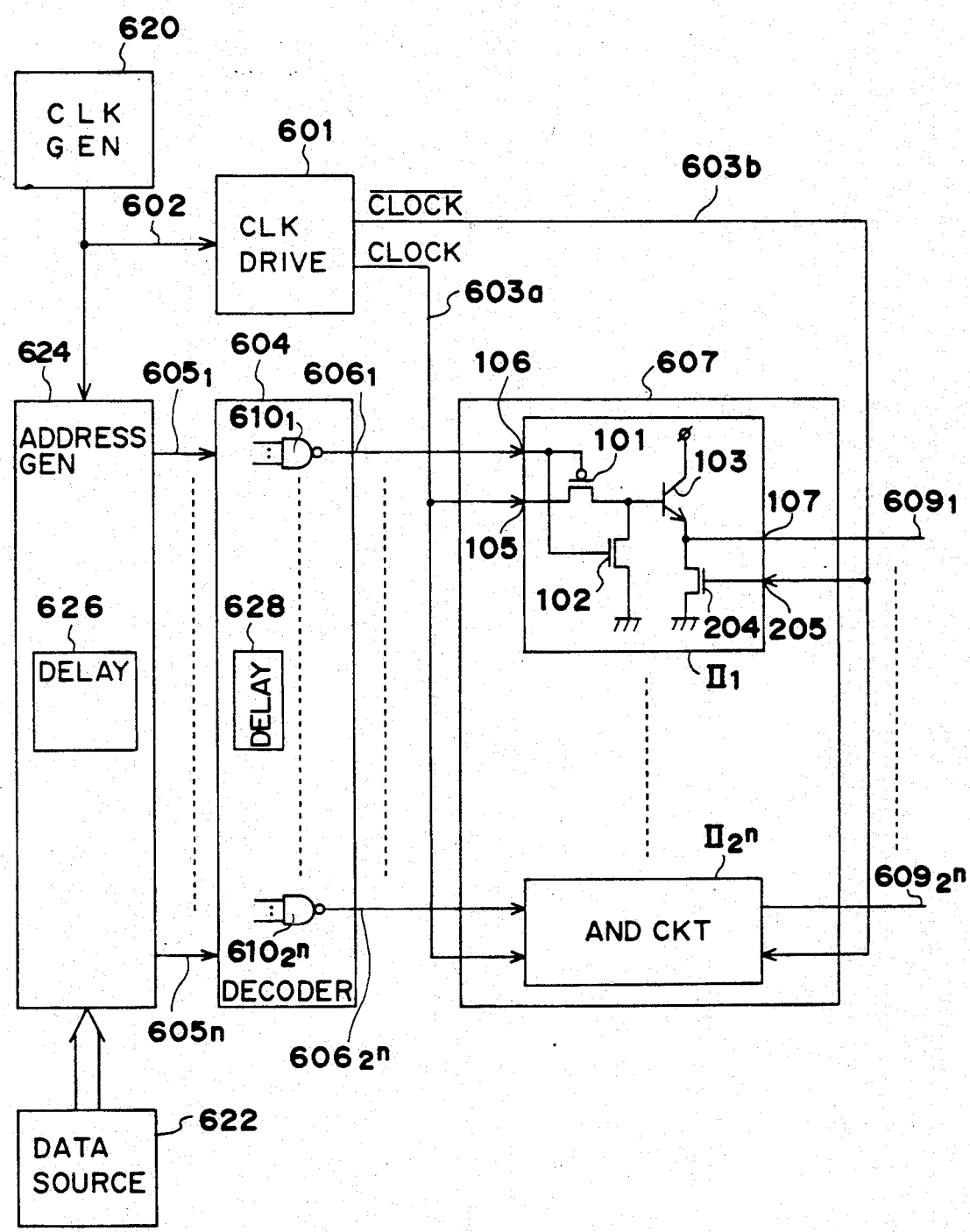
FIG. 6 is a block diagram of an address circuit employing the AND circuit of FIG. 2, according to the present invention.

Referring to FIG. 6, a block diagram of an integrated circuit employing the AND circuit II shown in FIG. 2 is shown. Reference numeral 620 designates a clock generator for producing clock pulses along line 602 (FIG. 10); reference numeral 601, a clock signal driver for producing CLOCK signal along line 603a and $\overline{CLOCK}$ signal along line 603b; reference numeral 622, a data source for generating data necessary for making address data; reference numeral 624, an address generator for producing an n-bit address data along lines $605_1$ ... $605_n$ upon receipt of data from data source 622; reference numeral 626, a delay circuit provided in the address generator 624 for delaying the generation of the n-bit address data by a predetermined time T1 (FIG. 10), which is less than the half clock cycle, from the beginning of each clock cycle; reference numeral 604, a decoder having a plurality of NAND gates $610_1$ ... $610_{2^n}$ for producing address data along output lines $606_1$ ... $606_{2^n}$ in a negative logic such that one output line determined by the n-bit address data produces a LOW level DAIA signal and the remaining $2^n-1$ output lines produce a HIGH level $\overline{DATA}$ signal; reference numeral 628, delay circuit provided in decoder 604 for delaying the generation of the $\overline{DATA}$ signals by a predetermined time T2 (FIG. 10) from the receipt of the n-bit address data; and reference numeral 607, a word line driver having $2^n$ AND circuits $II_1$ ... $II_{2^n}$ from which word lines $609_1$ ... $609_{2^n}$ extend to designate one word line.

Figure 10:
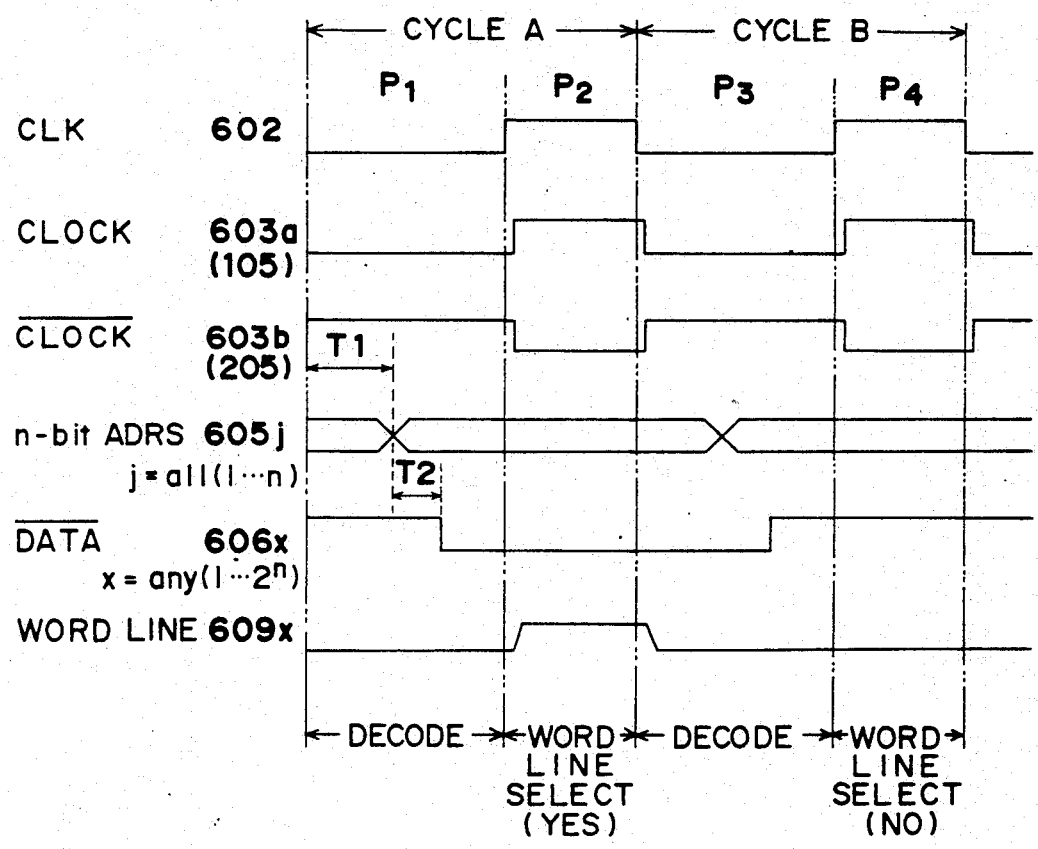
FIG. 10 is a timing chart for illustrating the operation of an address circuit employing the AND circuit of the present invention.
Figure 11:
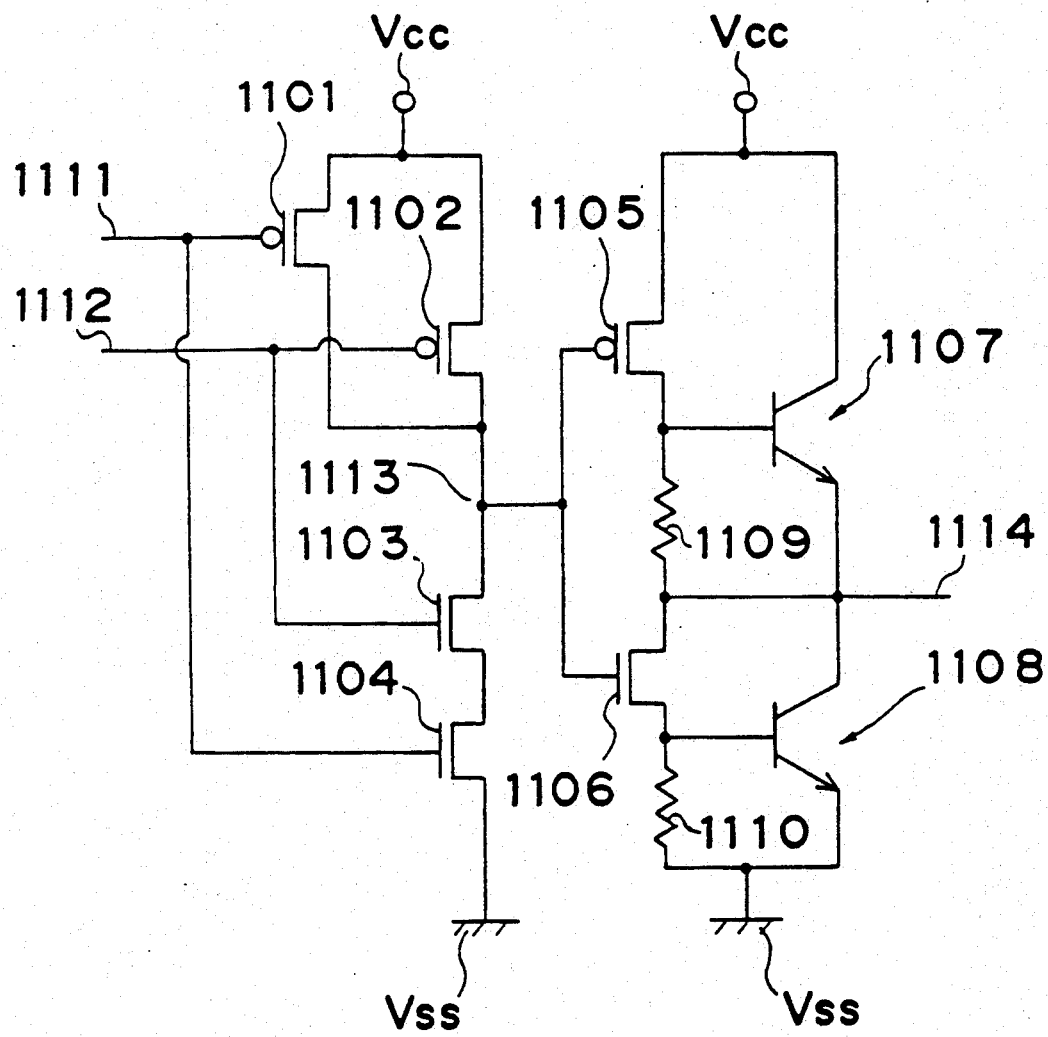
FIG. 11 is a block diagram of the AND circuit according to the prior art.
Figure 12:
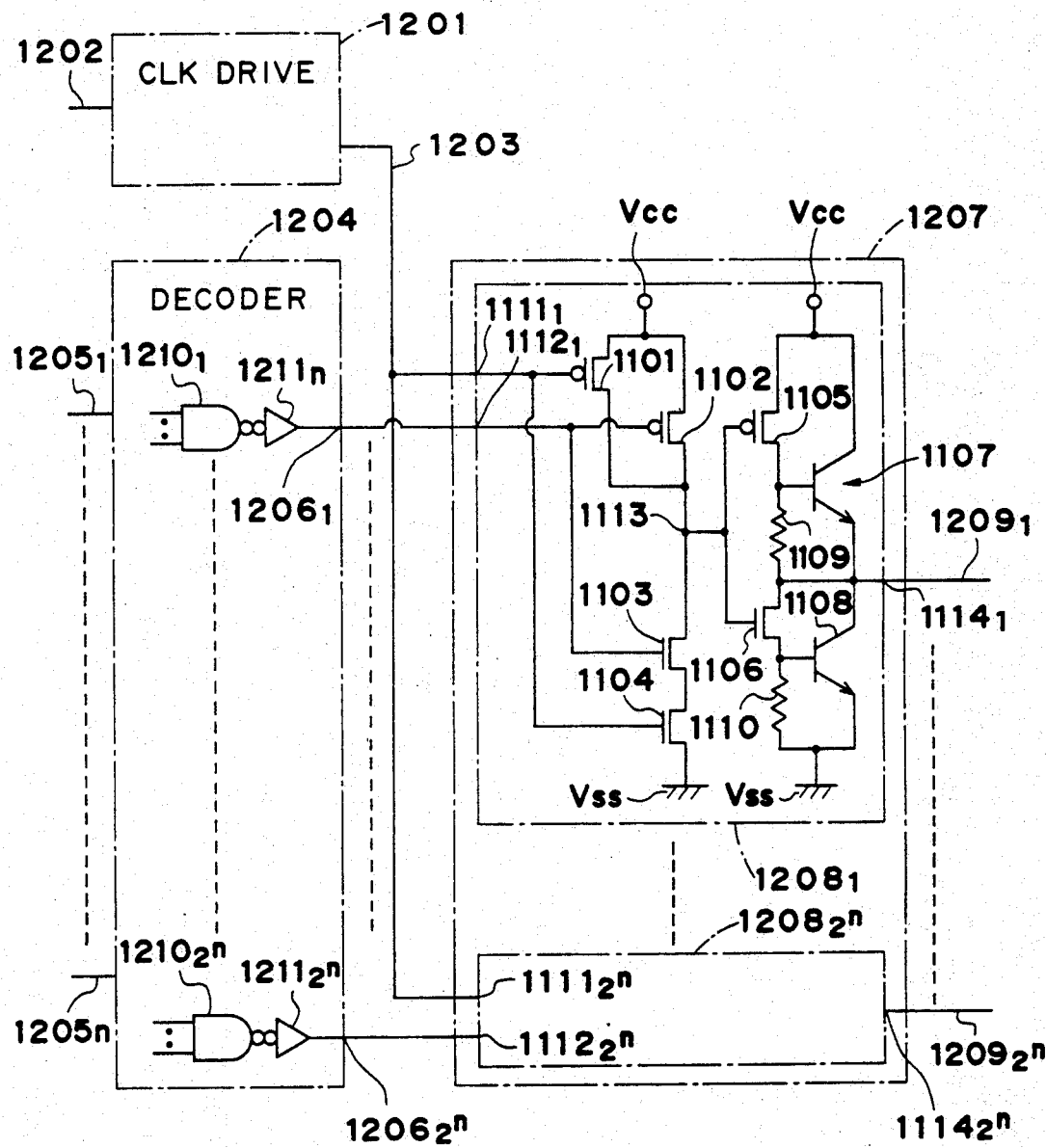
FIG. 12 is a block diagram of a prior art address circuit employing the AND circuit of FIG. 11.

The address circuit shown in FIG. 6 is a word line driving circuit of a clock synchronizing type formed in a semiconductor integrated circuit, and the operation thereof will be described with reference to the timing chart shown in FIG. 10.

The N-channel MOS FET 204 is prepared for the purpose of making quick response of the AND output terminal 107 to be set in LOW level. The controlling signal, which is the $\overline{CLOCK}$ signal, for controlling the N-channel MOS FET 204 is inputted to the input terminal 205 through line 603b.

In operation, during the first half cycle P1 in cycle A, clock drive circuit 601 produces a LOW level CLOCK signal along line 603a and a HIGH level $\overline{CLOCK}$ signal along line 603b. Also, the address generator 624 receives address data from data source 622 at the beginning of the half cycle period P1 and produces, after the delay time of T1, an n-bit address data along lines $605_1$ ... $605_n$. Then, in the decoder 604, n-bit data is analyzed to determine which one of the $2^n$ output lines $606_1$ ... $606_{2^n}$ should produce a LOW level $\overline{DATA}$ signal. Then, after the delay time of T2, the determined output $606_x$ (x is any one between 1 and $2^n$) produces a LOW level $\overline{DATA}$ signal and the remaining outputs produce a HIGH level $\overline{DATA}$ signal. Accordingly, at the end of the first half cycle P1, the P-channel MOS FET 101 in only one AND circuit $II_x$ is made conductive, but the P-channel MOS FETs 101 in the AND circuits other than AND circuit $II_x$ are made non-conductive. In this manner, the $\overline{DATA}$ signals along lines $606_1$ ... $606_{2^n}$ are determined during the first half clock cycle at which all the word lines $609_1$ ... $609_{2^n}$ are maintained LOW.

Next, during the second half cycle P2 in cycle B, clock drive circuit 601 produces a HIGH level CLOCK signal along line 603a and a LOW level $\overline{CLOCK}$ signal along line 603b. Thus, in the AND circuit $II_x$, the HIGH level CLOCK signal is applied through the P-channel MOS FET 101 to transistor 103 to produce a HIGH level word line selection signal from output $609_x$. But, in the remaining AND circuits, the HIGH level CLOCK signal is cut off at P-channel MOS FET 101, so that the transistor 103 in those AND circuits receive a LOW level signal to the base thereof. Thus, a LOW level word line selection signal is produced from outputs other than output $609_x$.

Cycle B shows a case in which, during the first half cycle P3, the output $606_x$ is selected as producing a HIGH level $\overline{\text{DATA}}$ signal. In this case, during the second half cycle P4, a LOW level word line selection signal is produced from output $609_x$.

As apparent from the above, in the address circuit of the present invention, since the CLOCK signal is applied along line 603a, not to the gate where the high load capacitance is required, but to the source of P-channel MOS FETs 101 in AND circuits $II_1 \ldots II_{2n}$, the load capacitance of line 603a is reduced greatly. As a result, it is possible to reduce the delay time when selecting a word line by a HIGH level word line selection signal.

Furthermore, an address circuit according to the present invention has a plurality of AND circuits, each having a reduced number of transistors. Thus, according to the address circuit of the present invention, the delay time can be further reduced, and also the layout area for making the AND circuit can be made smaller.

Figure 7:
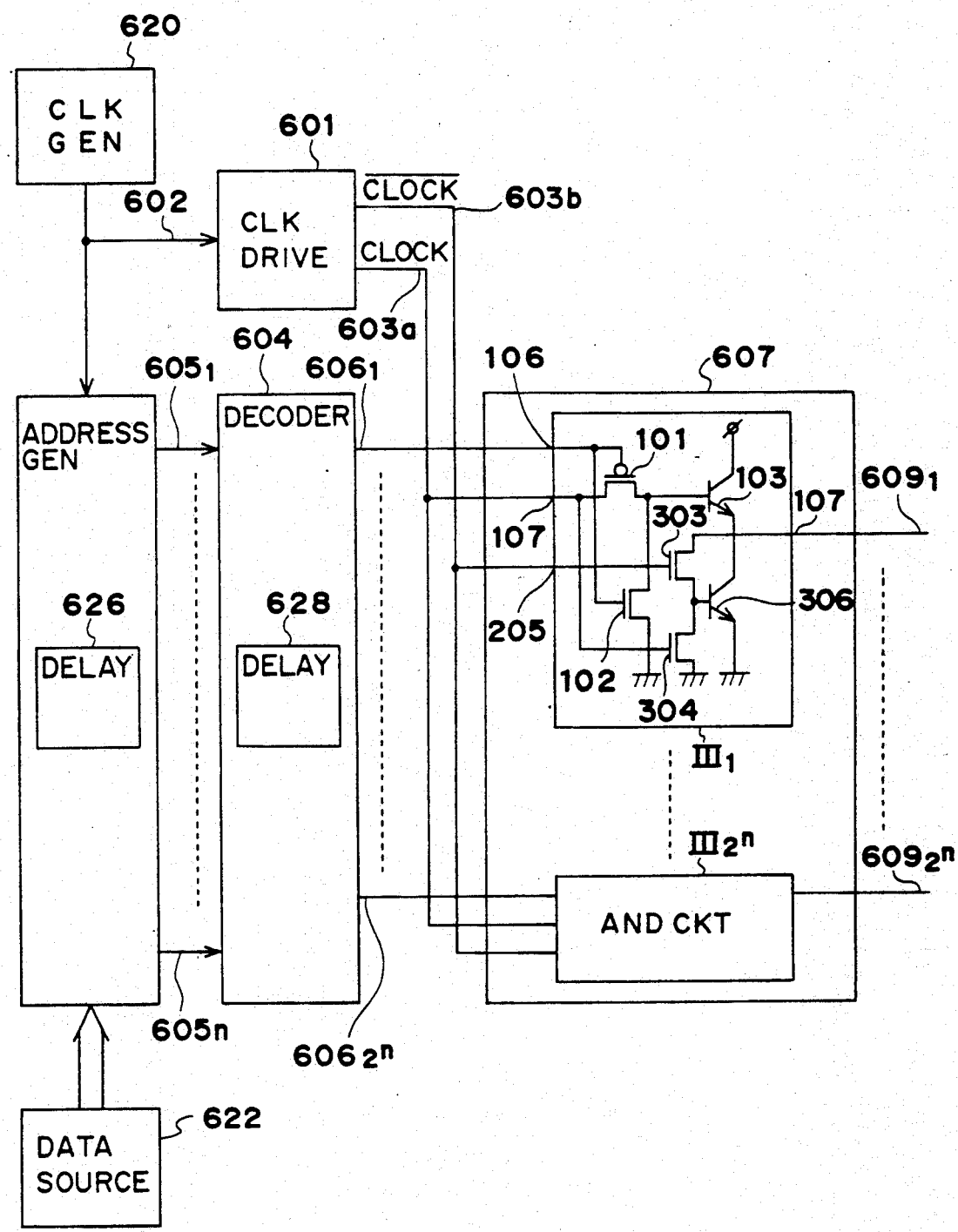
FIG. 7 is a block diagram of an address circuit employing the AND circuit of FIG. 3, according to the present invention.

Referring to FIG. 7, a block diagram of an integrated circuit employing the AND circuit III shown in FIG. 3 is shown.

Figure 8:
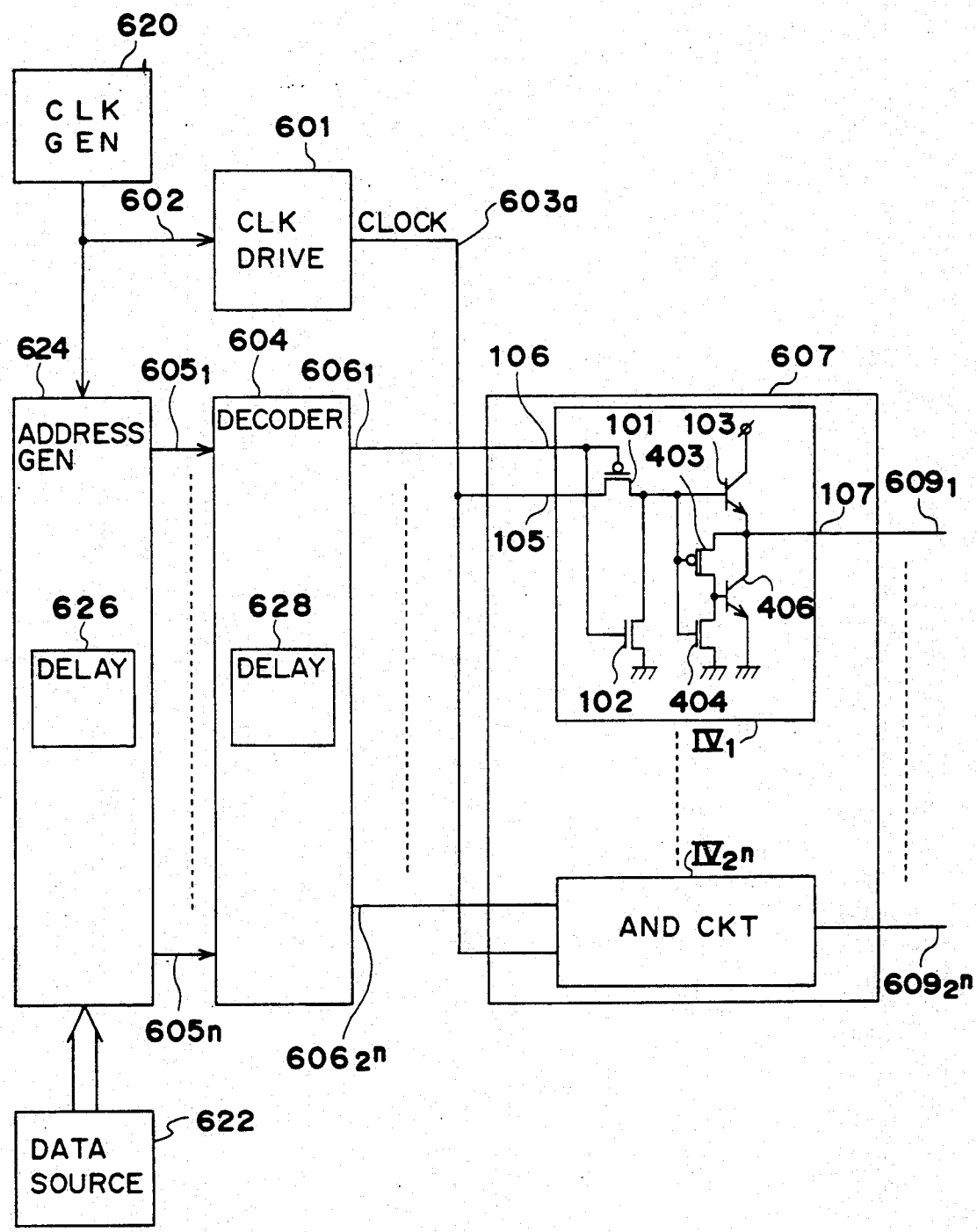
FIG. 8 is a block diagram of an address circuit employing the AND circuit of FIG. 4, according to the present invention.

Referring to FIG. 8, a block diagram of an integrated circuit employing the AND circuit IV shown in FIG. 4 is shown.

Figure 9:
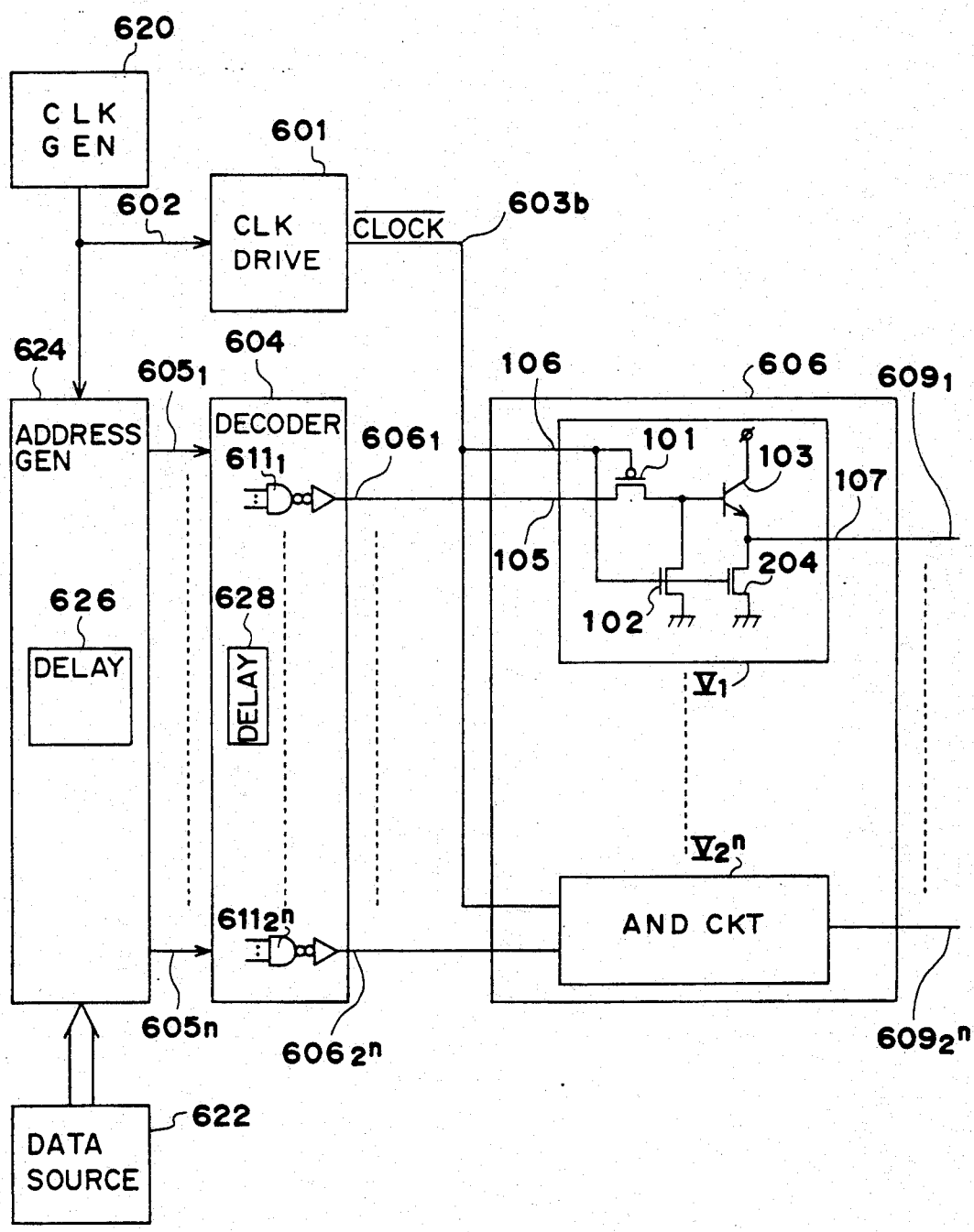
FIG. 9 is a block diagram of an address circuit employing the AND circuit of FIG. 5, according to the present invention.

Referring to FIG. 9, a block diagram of an integrated circuit employing the AND circuit V shown in FIG. 5 is shown.

Since these integrated circuits shown in FIGS. 7, 8 and 9 are substantially the same as the integrated circuit shown in FIG. 6, a detailed description therefor is omitted. The only difference is that in FIG. 9, decoder 604 includes, in place of NAND gates $610_1 \ldots 610_{2n}$, inverter coupled NAND gates $611_1 \ldots 611_{2n}$ so that address data along output lines $606_1 \ldots 606_{2n}$ are in a positive logic such that one output line determined by the n-bit address data produces a HIGH level DATA signal and the remaining $2^n - 1$ output lines produce a LOW level DATA signal.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An address circuit for producing a word line selection signal along at least one of a plurality of word lines, comprising:

clock signal driving means for producing clock signals;

address data generating means for generating address data along a plurality of address lines and designating at least one selected address line;

word line driving means comprising a plurality of AND circuits, each AND circuit comprising:

a first MOS FET having a source thereof connected to said clock signal driving means and a gate thereof connected to said one address line of said address data generating means;

a second MOS FET having a gate thereof connected to said one address line of said address data generating means, a source thereof connected to the ground and a drain thereof connected to a drain of said first MOS FET;

a first transsistor having a base thereof connected to said drain of said first MOS FET, and collector-emitter thereof connected between an electric power supply line and the ground; and an impedance unit connected in series to said collector-emitter and one end of said impedance unit connected to one of said word lines.

2. An address circuit as claimed in claim 1, wherein said address data generating means comprises:

an address generator for generating an n-bit signal representing one of a plurality of word lines;

a decoder means, coupled to said address generator and responsive to said n-bit signal, for producing a plurality of address signals along a plurality of address lines, respectively, and designating at least one selected address line.

3. An address circuit as claimed in claim 2, wherein said address generator comprises a first delay circuit for delaying the generation of said n-bit signal for a predetermined first delay time after the beginning of each clock cycle period, said first delay time being less than a half clock cycle period.

4. An address circuit as claimed in claim 3, wherein said decoder means comprises a second delay circuit for delaying the generation of said plurality of address signals for a predetermined second delay time after the end of said first delay time, a sum of said first and second delay times being less than a half clock cycle period.

5. An address circuit as claimed in claim 1, wherein said first MOS FET is an N-channel MOS FET.

6. An address circuit as claimed in claim 1, wherein said first MOS FET is a combination of P-channel MOS FET and N-channel MOS FET connected in parallel.

7. An address circuit as claimed in claim 1, wherein said impedance unit is a third MOS FET having source-drain connected in series to said collector-emitter.

8. An address circuit as claimed in claim 7, wherein said third MOS FET has a gate thereof connected to an input terminal for receiving a signal which is in opposite phase to said clock signal applied to said source of said first MOS FET.

9. An address circuit as claimed in claim 1, wherein said impedance unit comprises:

a second transistor having collector-emitter connected in series to said collector-emitter of said first transistor;

third MOS FET connected between collector and base of said second transistor, a gate thereof being connected to a third input terminal for receiving a signal which is in opposite phase to said clock signal applied to said source of said first MOS FET; and a fourth MOS FET connected between base and emitter of said second transistor, a gate thereof being connected to said clock signal driver means.

10. An address circuit as claimed in claim 9, wherein said third and fourth MOS FETs are N-channel MOS FETs.

11. An address circuit as claimed in claim 1, wherein said impedance unit comprises:

a second transistor having collector-emitter connected in series to said collector-emitter of said first transistor;

a third MOS FET connected between collector and base of said third transistor, a gate thereof being connected to the base of said first transistor; and a fourth MOS FET connected between base and emitter of said second transistor, a gate thereof being connected to the base of said first transistor.

12. An address circuit as claimed in claim 11, wherein said sixth MOS FET is a P-channel MOS FET, and said seventh MOS FET is an N-channel MOS FET.

* * * * *

UNITED STATES PATENT AND TRADEMARK OFFICE
CERTIFICATE OF CORRECTION

PATENT NO. : 5,218,241
DATED : June 8, 1993
INVENTOR(S) : Tomohiro Kurozumi

It is certified that error appears in the above-indentified patent and that said Letters Patent is hereby corrected as shown below:

Column 12, line 52 (claim 9) insert --a-- before the word "third".

Column 12, line 54 (claim 9) delete "a third" and substitute --an--.

Signed and Sealed this

Fifteenth Day of March, 1994

Attest:

BRUCE LEHMAN

*Attesting Officer*  *Commissioner of Patents and Trademarks*